United States Patent [19]

Kokubo

[11] Patent Number: 4,608,491

[45] Date of Patent: Aug. 26, 1986

[54] ELECTRON BEAM INSTRUMENT

[75] Inventor: Yasushi Kokubo, Tokyo, Japan

[73] Assignee: Jeol Ltd., Tokyo, Japan

[21] Appl. No.: 668,096

[22] Filed: Nov. 5, 1984

[30] Foreign Application Priority Data

Nov. 11, 1983 [JP] Japan .................................. 58-212186

[51] Int. Cl.$^4$ .......................... G01N 23/00; H01J 3/26
[52] U.S. Cl. ................................. 250/311; 250/396 R
[58] Field of Search ........... 250/396 R, 396 ML, 311, 250/310; 313/361.1

[56] References Cited

U.S. PATENT DOCUMENTS

| | | | |
|---|---|---|---|
| 2,973,433 | 2/1961 | Kramer | 250/396 |
| 3,753,034 | 8/1973 | Spicer | 250/396 |
| 4,044,254 | 8/1977 | Krisch et al. | 250/311 |
| 4,214,162 | 7/1980 | Hoppe et al. | 250/311 |

OTHER PUBLICATIONS

Proceedings *Electron Microscopy Society of America*, forty-first annual meeting 1983, edited by G. W. Bailey, pp. 406–407.

*Primary Examiner*—Bruce C. Anderson
*Attorney, Agent, or Firm*—Webb, Burden, Robinson & Webb

[57] ABSTRACT

Under certain conditions, the electron beam from the electron gun of an electron microscope is deflected by deflecting means in such a way that the beam impinges on one point on a filmy crystalline specimen at a specific tilt angle while the direction of the tilt is rotated, to obtain an electron micrograph of the specimen. In the conventional astigmatism correcting device, however, the rotation of the direction of the tilt makes it impossible to correct the astigmatism of the objective lens of the microscope which forms such an electron micrograph. In the instrument according to the present invention, astigmatism correcting signals synchronized with the rotation of the direction of the tilt are supplied to the astigmatism correcting device so that the obtained electron micrograph may be unaffected by the astigmatism of the objective lens despite the periodic rotation of the direction of the tilt.

2 Claims, 3 Drawing Figures

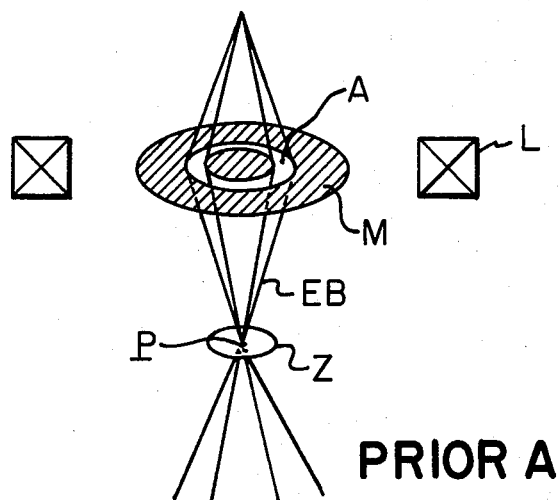
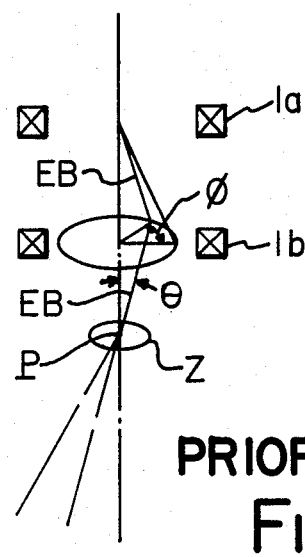
PRIOR ART
Fig. 1
PRIOR ART
Fig. 2
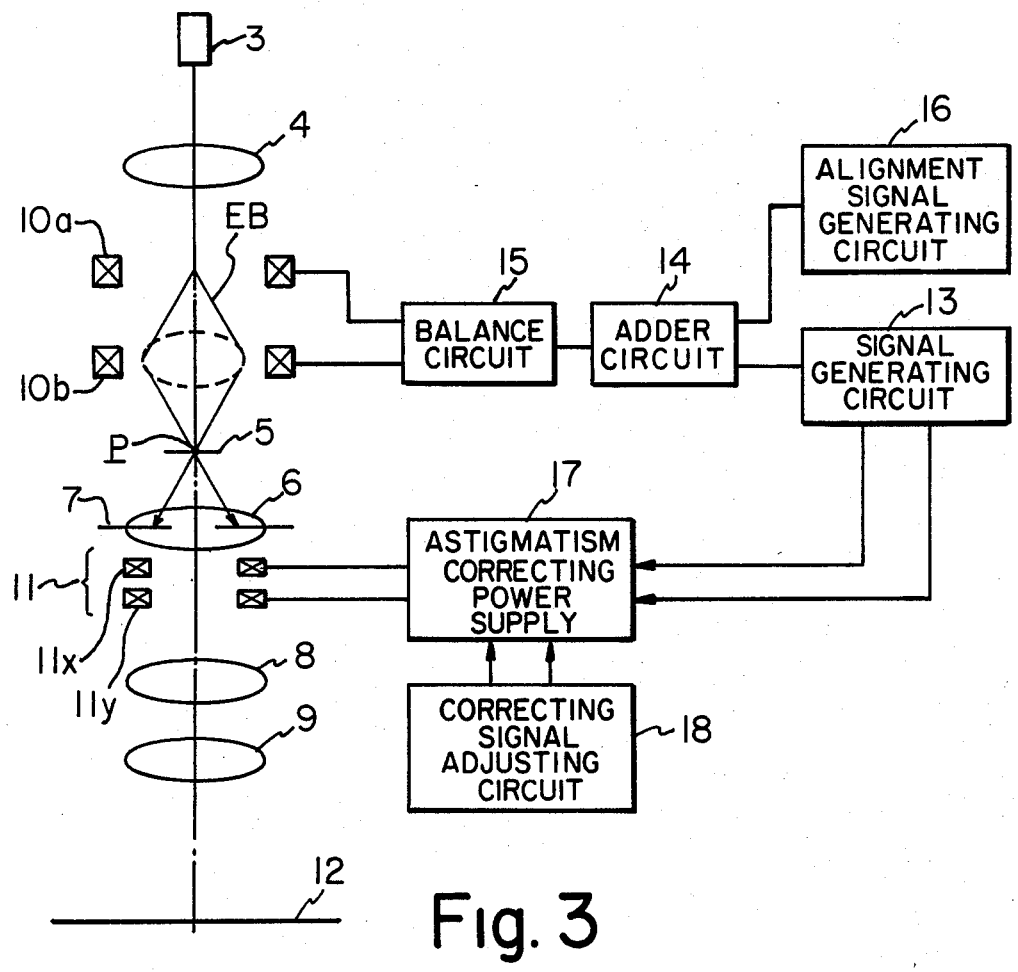
Fig. 3

ELECTRON BEAM INSTRUMENT

BACKGROUND OF THE INVENTION

The present invention relates to an electron beam instrument for generating an electron beam in the form of a hollow cone which is directed onto a specimen to observe it.

Dark-field illumination has long been used in which a filmy specimen is irradiated with an electron beam that is emitted from an electron beam instrument at some angle to the optical axis. Of the scattered electron wave (beam) which has passed through the specimen, the wave traveling in the direction of the optical axis is collected to obtain a dark-field image of the specimen. In this method, only a part of the scattered wave contributes to the formation of the image and, therefore, the image is not sufficiently bright. In addition, it has the disadvantage of directivity.

In recent years, some attempts have been made to collect all the scattered wave having the same scattering angle to produce an image. In particular, referring to FIG. 1, a shade plate M formed with an annular aperture A is used, and an electron beam EB passed through the plate M is directed onto one point P on a specimen. In another attempt, as shown in FIG. 2, an electron beam is deflected by two stages of deflection systems 1a and 1b, and the azimuth angle $\phi$ is swept while maintaining both the incident point on a specimen 2 and the tilt angle $\phi$ substantially fixed, thus creating substantially the same situation as in the case where an electron beam in the form of a hollow cone falls on one point on the specimen. In either case, the scattered wave passed through the specimen is collected to form an image of the specimen. This technique is described, for example, in "The Proceedings of the Electron Microscopy Society of America", held in Phoenix, Ariz., Aug. 8–12, 1983, pp. 406–407. Although the type of instrument shown in FIG. 2 has the advantage that the tilt angle $\theta$ of the electron beam entering the specimen can readily be changed, it cannot sufficiently correct the astigmatism of the object lens and hence cannot yield images with high resolution. This problem arises because the direction of the astigmatism varies with the direction of the tilt, or the azimuth angle, of the electron beam EB.

SUMMARY OF THE INVENTION

It is an object of the present invention to provide an instrument which is free of the drawbacks of the prior art instruments and which can produce images with high resolution by correcting astigmatism despite the rotation of the direction in which the electron beam is inclined.

The above and additional objects are achieved by an instrument comprising: deflecting means disposed in the stage preceding an object lens; circuitry for supplying deflection signals to the deflecting means to permit an electron beam to fall on one point on a specimen at an arbitrary tilt angle while rotating the direction in which the electron beam is tilted; an astigmatism correcting device for correcting the astigmatism of the object lens; and a means for supplying astigmatism correcting signals synchronized with the rotation of the direction of the tilt to the astigmatism correcting means.

The instrument according to the invention is so designed that the position of incidence of an electron beam on a specimen is maintained at one point and that the azimuth angle is periodically varied. This instrument has the advantage that astigmatism can be completely corrected.

BRIEF DESCRIPTION OF THE DRAWINGS

FIG. 1 is a schematic diagram for illustrating a prior art instrument;

FIG. 2 is a schematic diagram for illustrating another prior art instrument; and FIG. 3 is a block diagram of an instrument according to the present invention.

DESCRIPTION OF THE PREFERRED EMBODIMENT

Referring to FIG. 3, there is shown schematically an instrument embodying the concept of the present invention. This instrument includes an electron gun 3, a focusing lens 4, an objective lens 6, an objective lens aperture plate 7, an intermediate lens 8, and a projector lens 9. As is well understood, the actual physical structure would comprise a column that can be evacuated and, for example, coils and yokes defining the various lenses. The electron beam emitted by the electron gun 3 is focused by the condenser lens 4, and is directed to impinge on a specimen 5. Two stages of deflecting coils 10a and 10b are disposed between the focusing lens 4 and the objective lens 6. Each of these deflecting stages consists of an X deflection coil and a Y deflection coil. Disposed in a stage succeeding the objective lens 6 (beyond the objective lens moving along the optical axis away from the electron gun) is an XY astigmatism compensator 11 which consists of quadrupole lens coils 11x and 11y. (The coils are shown schematically in the drawing. Typically, the coils have pole pieces spaced 90 degrees apart with alternating polarity.) A fluorescent plate 12 is disposed in the stage succeeding the compensator 11.

A circuit 13 generates signals applied to the two stages of deflecting coils 10a and 10b for rotary sweep. The signals are defined by the expressions $$R \cdot \sin \omega t \qquad (1\text{-}1)$$

$$R \cdot \cos \omega t \qquad (1\text{-}2)$$

where t is the time, $\omega$ is a constant, and R is a variable constant value or a function of time t. The magnitude of R controls the tilt angle $\theta$. The output signals from the signal generating circuit 13 are directed to the deflecting coils 10a and 10b via an adder circuit 14 and a balance circuit 15.

An alignment signal generating circuit 16 produces a deflection signal for aligning purposes to the adder circuit 14. The alignment signal is used to bring the beam spot to a position on the specimen notwithstanding the rotating signals applied. The rotary sweep signals from the circuit 13 are added to the signal for alignment in the adder circuit 14. The resulting signals are then furnished to the deflecting coils 10a and 10b. The balance circuit 15 controls the ratio of the intensities of the signals supplied to the deflecting coils 10a and 10b so that the electron beam EB deflected by the deflecting coil 10a may be deflected back by the coil 10b to keep it impinging on the same point P on the specimen.

The signals from the rotary sweep signal generating circuit 13 are supplied to an astigmatism correcting power supply 17, which also receives from a correcting signal adjusting circuit 18 signals for correcting instinctive or residual astigmatism occuring when the electron beam is emitted on the axis. By receiving these input signals, the power supply 17 produces correcting signals given by $$S_x = R_1 \cdot R \cdot \cos \omega t + R_2 \cdot R \cdot \sin \omega t + C_x \qquad (2\text{-}1)$$

$$S_y = R_1 \cdot R \cdot \sin \omega t + R_2 \cdot R \cdot \cos \omega t + C_y \qquad (2\text{-}2)$$

where $R_1$ and $R_2$ are constant values that can be adjusted. These produced signals are provided to the aforementioned quadrupole coils 11x and 11y for correcting astigmatism. The values of $R_1$ and $R_2$ may be theoretically determined but, in this specific example, the values which have been previously found experimentally is employed.

In each of the above formulae, the first two terms express signals for correcting astigmatism that is caused by the rotary sweep of the electron beam. The last term expresses a signal which is used to correct the raw astigmatism and is derived from the correcting signal adjusting circuit 18. The signals from the circuit 18 have previously been adjusted to the on-axis irradiation of electron beam.

In the structure constructed as described above, the electron microscope is first placed in transmissive image observation mode. Specifically, the electron beam EB from the electron gun 3 is collimated well by the focusing lens 4 and directed onto the specimen 5. Then, an image of the specimen 5 is produced on the fluorescent plate 10 from the electron beam penetrated through the specimen. The amplitude component R is determined according to a desired value of the tilt angle θ, in order to cause the rotary sweep signal generating circuit 13 to deliver the signals given by the formulae (1-1) and (1-2) above. These signals are then fed to the deflecting coils 10a and 10b via the adder circuit 14 and the balance circuit 15, so that the electron beam EB is deflected away from the optical axis C by the coil 10a. Thereafter, the beam is deflected back toward the optical axis by the deflecting coil 10b. Thus, the azimuth angle φ of the irradiation is periodically changed while the point of incidence on the specimen 5 is maintained at the point P. As the electron beam EB hits the specimen in this way, some of the electron beam is diffracted by the specimen 5. Of the diffracted beam, the component which travels in the direction of the optical axis C is converged by means of the intermediate lens 8 and the projector lens 9, producing a transmissive electron image of the specimen on the fluorescent plate 12. At this time, the correcting signals which are produced in response to the signals indicating the azimuth angle φ and the tilt angle θ and which are given by the formulae (2-1) and (2-2) are supplied to the quadrupole coils 11x and 11y. Therefore, the optimum correcting signals are invariably supplied to the coils according to the azimuth angle φ and the tilt angle θ of the electron beam, irrespective of the rotary sweep of the beam. This makes it possible to present an image on the fluorescent plate 12 with high resolution, because it is free of astigmatism.

While a preferred embodiment of the invention has been described using specific terms, such description is for illustrative purposes only, and it is to be understood that various changes and variations may be made without departing from the spirit and scope of the invention. For example, although the correcting signals supplied to the astigmatism correcting quadrupole lens coils 11x and 11y are generated by the astigmatism correcting power supply in the above example, it is also possible to produce the correcting signals to be fed to the astigmatism correcting lenses under the instruction of a computer loaded with appropriate software.

What is claimed is:

1. In an electron beam instrument comprising a column that can be evacuated, said column having an electron gun at one end and an imaging means at the other end, said gun for emitting an electron beam along an optical axis extending through the imaging means, a specimen support means along the optical axis intermediate the gun and imaging means, electron lens means for condensing the electron beam and focussing it upon a specimen in a specimen support means, electron objective lens means near the specimen support means and projector lens means between the specimen and display means deflecting means disposed between the gun and an objective lens;

means for supplying deflection signals to the deflecting means to permit the electron beam to fall on one point on a specimen on the specimen stage at a selected tilt angle while rotating the direction in which the electron beam is tilted;

lens means between the specimen and imaging means for correcting the astigmatism of the objective lens; and means for supplying astigmatism correcting signals synchronized with the rotation of the direction of the tilt to said means for correcting the astigmatism.

2. In an electron beam instrument comprising a column that can be evacuated, said column having an electron gun at one end and an imaging means at the other end, said gun for emitting an electron beam along an optical axis extending through the imaging means, a specimen support means along the optical axis intermediate the gun and imaging means, electron lens means for condensing the electron beam and focussing it upon a specimen in a specimen support means, electron objective lens means near the specimen support means and projector lens means between the specimen and display means a deflecting means disposed between the gun and an object lens having X and Y deflecting coils serving to deflect an electron beam in the directions of X and Y axes, respectively, which are perpendicular to an optical axis;

a deflecting signal generating means for supplying deflecting signals given by $$R \cdot \sin \omega t$$

and $$R \cdot \cos \omega t,$$

where t is time, ω is a constant, and R is an amplitude component that can be adjusted to the deflecting means to permit the electron beam to fall on one point on a specimen on the specimen stage at a selected tilt angle θ while rotating the azimuth angle φ of the tilt;

lens means between the specimen and imaging means comprising an XY astigmatism correcting device consisting of two quadrupole lenses that correct the astigmatism of the objective lens in the direction of the X and Y axes, respectively; and means for producing correcting signals $S_x$ and $S_y$ given by $$S_x = R_1 \cdot R \cdot \cos \omega t + R_2 \cdot R \cdot \sin \omega t + C_x$$

$$S_y = R_1 \cdot R \cdot \sin \omega t + R_2 \cdot R \cdot \cos \omega t + C_y$$

wherein $R_1$, $R_2$, $C_x$ and $C_y$ are constants which may be determined or calculated for the specific system, means for applying the astigmatism correcting signals synchronized with the rotation of the direction of the tilt to their respective quadrupole lenses.

* * * * *